United States Patent
Yoo et al.

(10) Patent No.: US 7,390,422 B2
(45) Date of Patent: *Jun. 24, 2008

(54) METHOD FOR MANUFACTURING PRINTING PLATE

(75) Inventors: Soon Sung Yoo, Gunpo-si (KR); Oh Nam Kwon, Yongin-si (KR); Heung Lyul Cho, Suwon-si (KR); Jung Jae Lee, Gwacheon-si (KR); Seung Hee Nam, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 32 days.

This patent is subject to a terminal disclaimer.

(21) Appl. No.: 11/476,660

(22) Filed: Jun. 29, 2006

(65) Prior Publication Data

US 2007/0015093 A1    Jan. 18, 2007

(30) Foreign Application Priority Data

Jun. 30, 2005    (KR)    ........... 10-2005-0058303

(51) Int. Cl.
*B44C 1/22*    (2006.01)

(52) U.S. Cl. ............. 216/41; 216/17; 216/23; 216/83; 430/300; 430/302

(58) Field of Classification Search ......... 216/17, 216/41, 83, 23; 430/300, 302
See application file for complete search history.

(56) References Cited

U.S. PATENT DOCUMENTS

2007/0048676 A1*    3/2007    Kwon et al. .......... 430/323

* cited by examiner

*Primary Examiner*—Shamim Ahmed
(74) *Attorney, Agent, or Firm*—Birch, Stewart, Kolasch & Birch, LLP

(57) ABSTRACT

A method for manufacturing a printing plate is realizes a precise and fine pattern by minimizing a variation of etching critical dimension. The method includes forming a hard mask having an opening on an insulating substrate; forming a first trench having a first depth in the insulating substrate using the hard mask; coating, patterning and developing a first photoresist over an entire surface of the insulating substrate including the hard mask; and forming at least a second trench having a second depth in the insulating substrate using the hard mask, wherein the second depth is deeper than the first depth.

15 Claims, 5 Drawing Sheets

METHOD FOR MANUFACTURING PRINTING PLATE

This application claims the priority under 35 U.S.C. §119 of the Korean Patent Application No. 10-2005-58303, filed on Jun. 30, 2005, which is hereby incorporated by reference as if fully set forth herein.

BACKGROUND OF THE INVENTION

1. Field of the Invention

The invention relates to a method for manufacturing a liquid crystal display (LCD) device, and more particularly, to a method for manufacturing a printing plate to realize a fine pattern.

2. Description of the Related Art

Various displays that can substitute for a cathode ray tube (CRT) have recently been developed, which have various advantages of portability, light weight, thin profile, small size, good picture quality, etc.

In general, an LCD device is includes a thin film transistor (TFT) array substrate, a color filter substrate, and a liquid crystal layer formed between the TFT array substrate and the color filter substrate. On the TFT array substrate, multiple gate lines are formed in perpendicular to multiple data lines, so as to define multiple pixel regions arranged in a matrix. Also, multiple TFTs are formed on unit pixel regions of the TFT array substrate, wherein the TFTs serve as switching devices. In addition, a pixel electrode of a transparent metal material is formed on the unit pixel regions. Then, RGB color filter layers and a black matrix layer are formed on the color filter substrate to correspond to the pixel electrode.

The TFT array substrate and the color filter substrate are separately manufactured. Before bonding the TFT array substrate and the color filter substrate to each other, steps of alignment coating, rubbing, spacer dispensing, and seal printing are sequentially performed.

After completing the above steps, the TFT array substrate and the color filter substrate are positioned opposite to each other, and then they are bonded to each other by heat and UV irradiation. At this time, a seal printing step is performed to bond the two substrates to each other and to prevent the outflow of liquid crystal molecules during injection of liquid crystals.

The seal printing step includes three methods or sub-steps of 1) a printing method, 2) a sandblasting method and 3) a dispensing method.

First, the printing method is generally used for manufacture of LCDs and plasma display panels (PDPs) because production facilities are simple and material efficiency is high. That is, after positioning a patterned screen above a substrate, a paste for formation of a wall is printed on the substrate by pressing. Through one printing process, it is possible to obtain a height of about 20 µm before firing. To form a wall having a height of 50 µm to 100 µm, it is necessary to perform the printing process 5 to 10 times, thereby requiring several drying steps. Accordingly, the printing method has low yield. In addition, since the glass substrate is deformed, it is difficult to realize high resolution.

Second, the sandblasting method is used to produce a fine wall of a large-sized panel. In the sandblasting method, a wall material is coated on a substrate, and is selectively removed to thereby form a wall. For example, a wall material is screen printed on an entire surface of a substrate. Then, a photoresist film is coated on the wall material and selectively patterned by exposure and development. After that, an abrasive material is sprayed onto the substrate so as to physically remove the substrate having no photoresist film, thereby forming the wall. At this time, the abrasive material may be used of $Al_2O_3$, SiC or glass particles, which is sprayed using compressed air or nitrogen gas. By the sandblasting method, it is possible to form the wall of 70 µm or less on the large-sized substrate. However, the glass substrate may be broken due to physical impact during firing. Also, the process of sandblasting is complicated, whereby the manufacturing cost increases. Further, an environmental pollution may be generated due to dust.

Third, the dispensing method is generally used for sealing a large-sized LCD or PDP. In the dispensing method, a paste is directly dispensed on a substrate by air pressure using line data from computer-assisted design (CAD) used for manufacture of a mask. In the dispensing method, it is possible to reduce the manufacturing cost of the mask, to obtain great degree of freedom for formation of a thick film, and to realize the simplified process and various applications.

FIG. 1 shows a schematic view illustrating a printing apparatus according to the related art. As shown in FIG. 1, the related art printing apparatus includes a printing table 11 supporting a substrate 10, a printing plate 1 having a convex (or concave) pattern 2 (for printing a pattern 4 on the substrate 10), a plate body 12, an anilox roll 16, a dispenser 18, and a doctor roll 15.

Then, a printing material 17 (for example ink) is supplied to the anilox roll 16 by the dispenser 18. The anilox roll 16 and the plate body 12 are formed in shape of cylindrical roll. The anilox roll 16 and the plate body 12 respectively revolve in arrow directions 48 and 46 and are in contact with each other.

The printing plate 1 adheres on an outer surface of the plate body 12, wherein the printing plate 1 has the convex (or concave) pattern 2 having a desired shape. The convex pattern 2 is positioned to be in contact with the substrate 10.

Also, the printing material 17 is supplied from the anilox roll 16 to the convex pattern 2, and then the printing material 17 of the convex pattern 2 is printed on the substrate 10. The substrate 10 is positioned on the printing table 11. During printing, the substrate 10 is moved to an arrow direction 47.

The printing material 17 printed on the substrate 10 has a shape or pattern 4 corresponding to the convex pattern 2, which is referred to as the printing result. Here, the printing result is formed in shape of frame.

The anilox roll 16 is in contact with the doctor roll 15 as well as the convex pattern 2. The doctor roll 15 uniformly coats the printing material 17 supplied from the dispenser 18 onto the outer surface of the anilox roll 16. Accordingly, the doctor roll 15 is in contact with the anilox roll 16 within a range between a portion of supplying the printing material 17 and a portion being in contact with the convex pattern 2. Instead of the doctor roll 15, a plate-shaped doctor blade may be used. Also, instead of the dispenser 18, another cylindrical roll may be used so as to provide the printing material 17 to the anilox roll 16.

Generally, the printing apparatus is used to form letters or figures on packing paper. However, the printing apparatus may be used to form various patterns on thin films. For example, an alignment layer or a sealant may be printed on a glass substrate of an LCD device by printing a polyimide thin film.

Hereinafter, a method for manufacturing a printing plate according to the related art will be described with reference to the accompanying drawings.

FIGS. 2A to 2E are cross sectional views illustrating a related art method for manufacturing a printing plate.

As shown in FIG. 2A, a metal layer 52 for a hard mask is deposited on an insulating substrate 51, and photoresist 53 is coated on the metal layer 52. The metal layer 52 is formed of Cr or Mo. Then, the photoresist 53 is selectively patterned by exposure and development to thereby define a pattern area.

Referring to FIG. 2B, the metal layer 52 is selectively removed using the patterned photoresist 53 as a mask to thereby form a metal layer pattern 52*a*.

As shown in FIG. 2C, the photoresist 53 is removed. The photoresist 53 is removed using oxygen gas plasma or various oxidizers to form the metal layer pattern 52*a*. When using oxygen gas plasma, oxygen gas plasma is generated by providing oxygen gas under vacuum and high voltage conditions, and the oxygen gas plasma decomposes the photoresist, whereby the photoresist is removed.

As shown in FIG. 2D, the exposed insulating substrate 51 is selectively etched using the metal layer pattern 52*a* as a mask to thereby form a trench 54 having a depth of about 20 µm. When etching the insulating substrate 51, an isotropic etching method using HF-based etchant is used.

As shown in FIG. 2E, the metal layer pattern 52*a* is removed, thereby completing the printing plate.

The completed printing plate is then installed on the printing apparatus shown in FIG. 1. Then, after the printing material is coated on the anilox roll, the anilox roll is in contact with the printing plate. Thus, the printing material is printed on the predetermined pattern of the printing plate, and the printing material of the printing plate is printed on the substrate to thereby obtain the printing result of the predetermined pattern.

However, the related art method for manufacturing the printing plate has the following disadvantages.

In the method for manufacturing the printing plate according to the related art, the trench having the predetermined depth is formed by the isotropic etching method of etching the insulating substrate using the metal layer pattern as the mask, whereby the etching critical dimension (CD) is large. As a result, it is difficult to manufacture a precise printing plate. That is, if the etching thickness of the insulating substrate is about 5 µm, it is impossible to obtain a line width of 10 µm or less ('A' of FIG. 2D).

SUMMARY OF THE INVENTION

Accordingly, the invention is directed to a method for manufacturing a printing plate that substantially obviates one or more problems due to limitations and disadvantages of the related art.

An object of the invention is to provide a method for manufacturing a printing plate to realize a precise and fine pattern by minimizing a variation of etching critical dimension (CD).

To achieve these objects and other advantages and in accordance with the purpose of the invention, as embodied and broadly described herein, a method for manufacturing a printing plate includes, in part, forming a hard mask having an opening over an insulating substrate; forming a first trench having a first depth in the insulating substrate using the hard mask; coating a first photoresist over an entire surface of the insulating substrate including the hard mask; patterning the first photoresist by entire exposure and development using the hard mask; forming a second trench having a second depth in the insulating substrate using the hard mask, wherein the second depth is deeper than the first depth; coating a second photoresist over the entire surface of the insulating substrate including the hard mask; patterning the second photoresist by entire exposure and development using the hard mask; forming a third trench having a third depth in the insulating substrate using the hard mask, wherein the third depth is deeper than the second depth; and removing the hard mask.

The invention in part, pertains to a method for manufacturing a printing plate that includes forming a hard mask having an opening over an insulating substrate; forming a first trench having a first depth in the insulating substrate using the hard mask; forming at least one subsequent trench having a subsequent depth in the insulating substrate using the hard mask, the depth of the subsequent trench being deeper than that of the previous trench, each subsequent trench being formed by: coating a photoresist over an entire surface of the insulating substrate including the hard mask, patterning the photoresist by exposing and developing using the hard mask, forming the subsequent trench in the insulating substrate using the hard mask, wherein the subsequent depth is deeper than the previous depth; and removing the hard mask. In the invention, the photoresist remaining may be removed after forming each subsequent trench. Alternately, all photoresists may be removed together after removing the hard mask.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

Reference will now be made in detail to the preferred embodiments of the invention, examples of which are illustrated in the accompanying drawings. Wherever possible, the same reference numbers will be used throughout the drawings to refer to the same or like parts.

FIGS. 3A to 3H show cross sectional views illustrating a method for manufacturing a printing plate according to the invention.

Figure 3A:
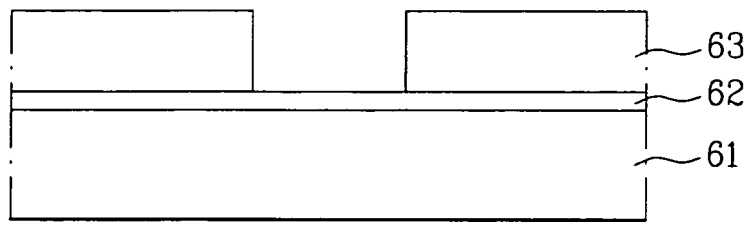
FIGS. 3A to 3H show cross sectional views illustrating a method for manufacturing a printing plate according to the invention.

As shown in FIG. 3A, a metal layer 62 for a hard mask is deposited on an insulating glass substrate 61, and a first photoresist 63 is coated over the metal layer 62. The metal layer 62 may be formed of Cr, Mo or any other suitable material. Then, the first photoresist 63 is selectively patterned by exposure and development to thereby define a pattern area.

Figure 3B:
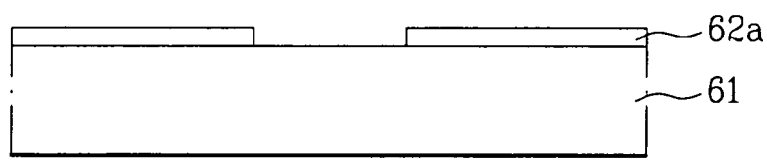

FIG. 3B shows the metal layer 62 being selectively removed using the patterned first photoresist 63 as a mask, thereby forming a metal layer pattern 62a. The first photoresist 63 is then removed.

To form the metal layer pattern 62a, the first photoresist 63 that was used as the mask is removed using oxygen gas plasma or any other suitable oxidizing technique. When using oxygen gas plasma, oxygen gas plasma is generated by providing oxygen gas under vacuum and high voltage conditions, and the oxygen gas plasma decomposes the photoresist, whereby the photoresist is removed.

Figure 3C:
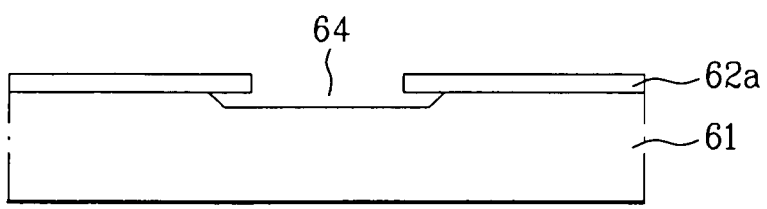

As shown in FIG. 3C, the exposed insulating substrate 61 is selectively etched using the metal layer pattern 62a as a mask, thereby forming a first trench 64 having a first depth of about 2 μm to 6 μm. When etching the insulating substrate 61, an isotropic etching method using HF-based etchant may be preferably used. However, any other suitable etching technique may be used. On forming the first trench 64 by the isotropic etching method, etched portions extend to lateral sides of the first trench 64. As the depth of the first trench 64 decreases, it is possible to decrease the etched portions at the lateral sides of the first trench 64.

Figure 3D:
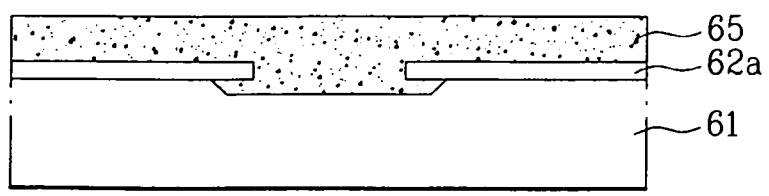

As shown in FIG. 3D, a second photoresist 65 is coated over the entire surface of the insulating substrate 61 including the first trench 64. The second photoresist 65 may be formed by a spin coating method, by a spray coating method or by a dip coating method. The spin coating method rotates the wafer at high speed under a vacuum chuck, and is most generally used owing to advantageous characteristics of stability and uniformity.

Generally, photoresists are categorized into positive type and negative type photoresists.

A negative type photoresist is typically formed by adding a mixture of hard rubber resin and bis-diazide based compound to a photosensitive organic solvent formed of a bridging material. In negative photoresists, the portion irradiated with light is hardened into a net-like mesh by the bridging material, and a solubility differential is generated between the portions irradiated and not irradiated by light, to thereby form a pattern.

In positive type photoresists, the portion irradiated with light is dissolved by a developer (typically an alkali-based material), and the portion not irradiated with light is not dissolved, to thereby form the pattern using the solubility difference.

Generally, the positive type photoresist is formed of a mixture of quinone-diazide based photoresist, alkali-soluble phenol-based resin and organic solvent, wherein the mixture is insoluble. However, the mixture becomes soluble in the alkali etchant by light irradiation. However any appropriate chemical system can be used to form the photoresists.

In the method for manufacturing the printing plate according to the invention, a positive type photoresist is preferably used.

Figure 3E:
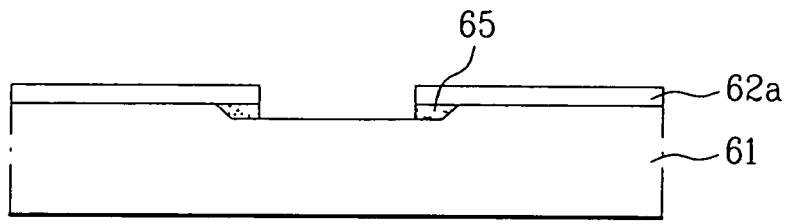

FIG. 3E shows that exposure and development are performed for the second photoresist 65 using the metal layer pattern 62a as a mask. Here, if the second photoresist 65 is coated over the entire surface of the insulating substrate 61, a lower portion of the metal layer pattern 62a is partially etched by the isotropic etching process for forming the first trench 64. In this case, the second photoresist 65 buries the etched lower portion of the metal layer pattern 62a.

The development of the second photoresist 65 may be performed by deposition or spraying. If the second photoresist 65 is developed by deposition, it is difficult to control the conditions of temperature, density and variations by time passage. However, in the case of the spraying, it becomes easier to control the above-mentioned conditions.

If the entire surface of the second photoresist 65 is exposed, the second photoresist 65 positioned under the metal layer pattern 62a remains without undergoing exposure, and the remaining second photoresist 66 (that is not under the metal layer pattern 62a) is completely removed by the exposure.

Figure 3F:
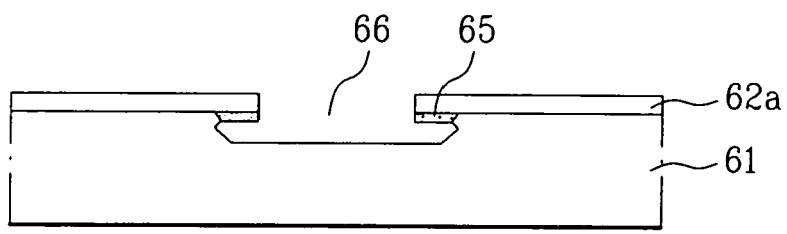

Then, as shown in FIG. 3F, the insulating substrate 61 is selectively removed using the metal layer pattern 62a as a mask, so that a second trench 66 is formed in the first trench 64. The second trench 66 has a second depth that is deeper than the first depth of the first trench 64.

As explained above, when isotropic etching forms the second trench 66, etched portions extend into lateral sides of the second trench 66. However, since the depth of the second trench 66 becomes low, it is thus possible to decrease the etched portions in the lateral sides of the second trench 66. Also, the second photoresist 65 remains in the lateral sides of the first trench 64, that is, under the metal layer pattern 62a, so that decreasing the etched portions in the lateral sides of the second trench 66 becomes possible.

Figure 3G:
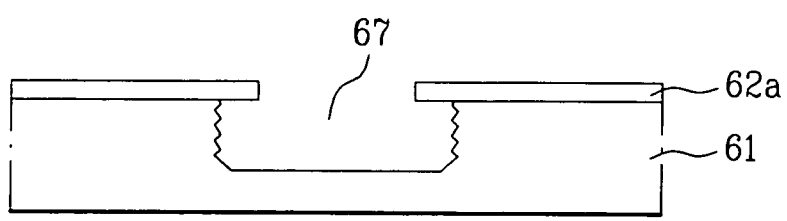

In FIG. 3G, a third photoresist (not shown) is coated over the entire surface of the insulating substrate 61 including the second trench 66. Then, exposure and development are performed whereby the third photoresist remains under the metal layer pattern 62a. The insulating substrate 61 is selectively etched to thereby form a third trench 67 having a third depth which is deeper than the second depth.

Similar to the first and second trenches, when the third trench 67 is formed by the isotropic etching, etched portions are extended into the lateral sides of the third trench 67. However, since the depth of the third trench 67 is low, it is possible to decrease the etched portions in the lateral sides of the third trench 67.

Also, a positive photoresist may preferably be used as the second photoresist 65 or the third photoresist. However, any suitable photoresist may be used.

Coating of the photoresist, exposure and development are repeatedly performed to form a complete trench having a desired depth using the metal layer pattern 62a and the remaining photoresist as masks.

Figure 3H:
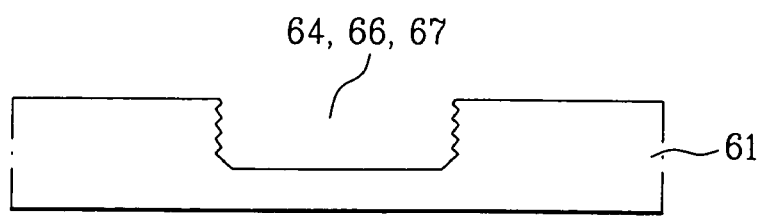

As shown in FIG. 3H, after removing the metal layer pattern 62a, the entire surface of the insulating substrate 61 is cleaned so as to remove the remaining photoresist and foreign particles generated by etching, thereby completing the printing plate according to the invention.

In the method for manufacturing the printing plate according to the invention, positive photoresist is repeatedly coated, and then patterned by the exposure and development. Also, the etched depth of the insulating substrate is controlled for each etching process using the metal layer pattern 62a and the remaining photoresist as masks so as to form a trench having the desired depth in the insulating substrate 61.

When the first, second and third trenches 64, 66 and 67 are formed, the first to third photoresists remaining under the metal layer pattern 62a may be simultaneously removed by the final cleaning process, or may be respectively removed after each of the trenches is formed.

Figure 1:
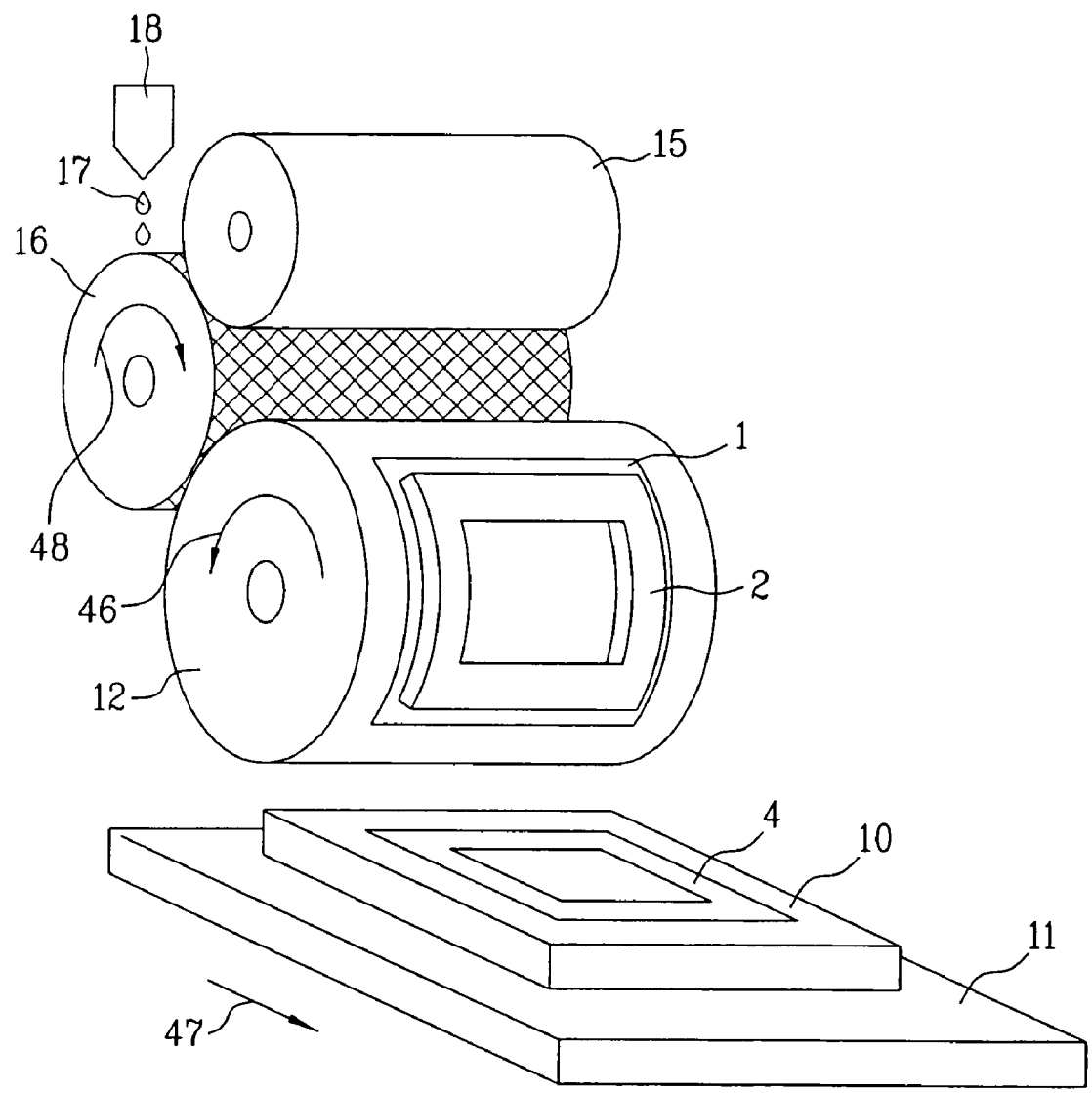
FIG. 1 shows a schematic view illustrating a printing apparatus according to the related art.
Figure 2A:
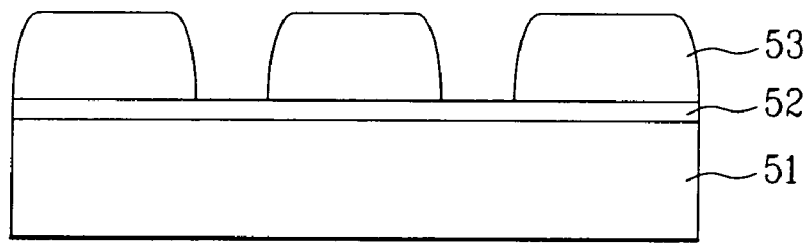
FIGS. 2A to 2E show cross sectional views illustrating a method for manufacturing a printing plate according to the related art.
Figure 2B:
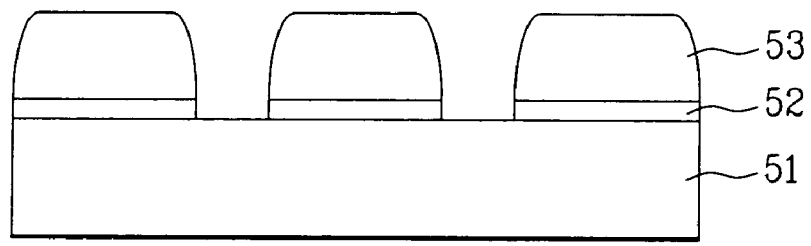
Figure 2C:
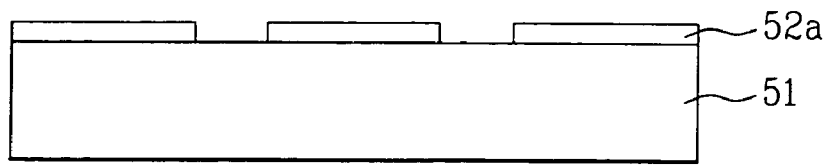
Figure 2D:
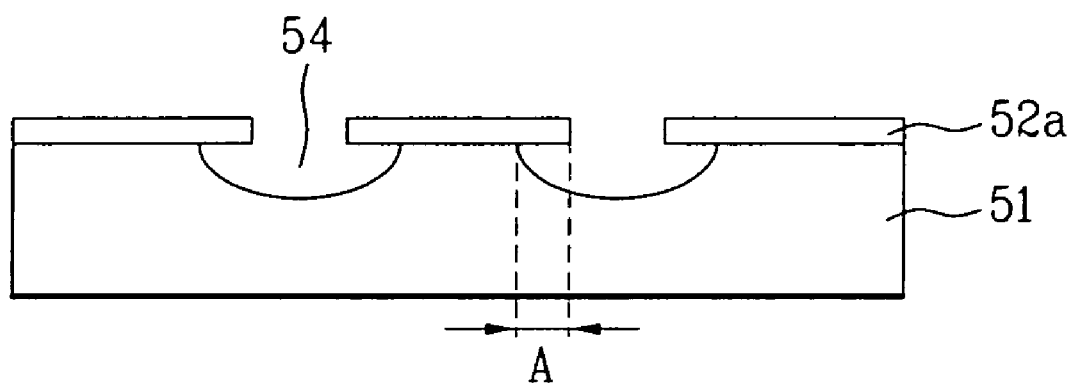
Figure 2E:
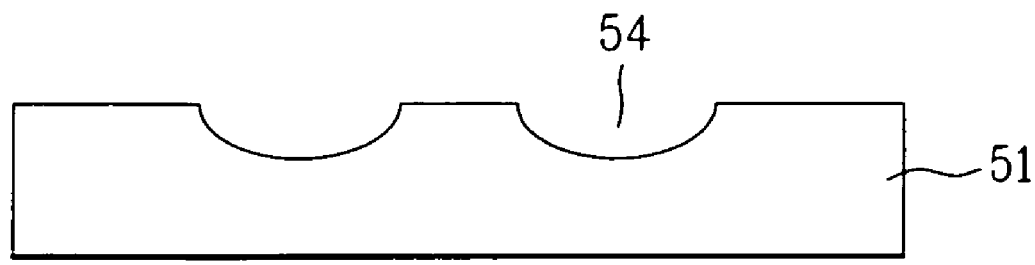

The complete printing plate is provided to the printing apparatus shown in FIG. 1. Then, after a desired pigment material is coated on the anilox roll, the anilox roll is contacted with the printing plate. Thus, the pigment material is printed on the predetermined pattern of the printing plate, and the pigment material of the printing plate is printed on a substrate, thereby obtaining the printing result of the predetermined pattern.

In contrast, the related art method for manufacturing the printing plate forms a trench of the desired depth in the insulating substrate by one etching process using the photoresist or hard mask. However, in the method for manufacturing the printing plate according to the invention, the trench of the desired depth is formed in the insulating substrate with the several etching processes using a hard mask, repeated deposition of photoresist, and entire exposure and development.

In one preferred embodiment of the invention, the three steps are performed so as to form a trench of the desired depth. However, the invention is not limited to the three steps. For example, any number of steps between two and ten steps may preferably be used.

As described above, the method for manufacturing the printing plate according to the invention has the following advantages.

A trench of a desired depth is formed in the insulating substrate by several etching processes utilizing the formation of the hard mask, deposition of the photoresist and entire exposure and development. That is, the etched depth of the trench for each etching process is controlled so as to minimize error due to the etching critical dimension, thereby forming a fine and precise pattern of a printing plate.

It will be apparent to those skilled in the art that various modifications and variations can be made in the invention without departing from the spirit or scope of the inventions. Thus, it is intended that the invention covers the modifications and variations of this invention provided they come within the scope of the appended claims and their equivalents.

What is claimed is:

1. A method for manufacturing a printing plate comprising:
   forming a hard mask having an opening over an insulating substrate;
   forming a first trench having a first depth in the insulating substrate using the hard mask;
   coating a first photoresist over surfaces of the insulating substrate and the hard mask;
   patterning the first photoresist such that a portion of the first photoresist remains at sidewalls of the first trench;
   forming a second trench having a second depth in the insulating substrate using the hard mask, wherein the second depth is deeper than the first depth;
   coating a second photoresist over surfaces of the insulating substrate and the hard mask;
   patterning the second photoresist such that a portion of the second photoresist remains at sidewalls of the second trench;
   forming a third trench having a third depth in the insulating substrate using the hard mask, wherein the third depth is deeper than the second depth; and
   removing the hard mask.

2. The method as claimed in claim 1, wherein the first and second photoresists are positive photoresists.

3. The method as claimed in claim 1, wherein the first to third trenches are formed by selectively etching the insulating substrate with an HF-based etchant.

4. The method as claimed in claim 1, wherein the hard mask is formed of a metal layer.

5. The method as claimed in claim 4, wherein the metal layer is formed of Cr or Mo.

6. The method as claimed in claim 1, further comprising removing the first photoresist remaining after forming the second trench.

7. The method as claimed in claim 1, further comprising removing the second photoresist remaining after forming the third trench.

8. The method as claimed in claim 1, further comprising removing the first and second photoresists together after removing the hard mask.

9. A method for manufacturing a printing plate comprising:
   forming a hard mask having an opening over an insulating substrate;
   forming a first trench having a first depth in the insulating substrate using the hard mask;
   forming at least one subsequent trench having a subsequent depth in the insulating substrate using the hard mask, the depth of the subsequent trench being deeper than that of the previous trench, each subsequent trench being formed by:
   coating a photoresist over surfaces of the insulating substrate and the hard mask,
   patterning the photoresist such that a portion of the photoresist remains at sidewalls of a trench by exposing and developing using the hard mask,
   forming the subsequent trench in the insulating substrate using the hard mask, wherein the subsequent depth is deeper than the previous depth; and
   removing the hard mask.

10. The method as claimed in claim 9, wherein the photoresist is a positive photoresist.

11. The method as claimed in claim 9, wherein the trenches are formed by selectively etching the insulating substrate with an HF-based etchant.

12. The method as claimed in claim 9, wherein the hard mask is formed of a metal layer.

13. The method as claimed in claim 12, wherein the metal layer is formed of Cr or Mo.

14. The method as claimed in claim 9, further comprising removing the photoresist remaining after forming each subsequent trench.

15. The method as claimed in claim 9, further comprising removing all photoresist together after removing the hard mask.

* * * * *